(12) United States Patent
Metzler

(10) Patent No.: US 6,667,237 B1
(45) Date of Patent: Dec. 23, 2003

(54) METHOD AND APPARATUS FOR PATTERNING FINE DIMENSIONS

(75) Inventor: Richard A. Metzler, Mission Viejo, CA (US)

(73) Assignee: VRAM Technologies, LLC, Costa Mesa, CA (US)

(*) Notice: Subject to any disclaimer, the term of this patent is extended or adjusted under 35 U.S.C. 154(b) by 153 days.

(21) Appl. No.: 09/689,074

(22) Filed: Oct. 12, 2000

(51) Int. Cl.[7] .................. H01L 21/302; H01L 21/461
(52) U.S. Cl. ............... 438/690; 438/184; 438/265; 438/303; 438/689; 438/694; 438/697; 438/239; 438/250; 438/253
(58) Field of Search .................. 438/690, 184, 438/230, 265, 303, 595, 689, 694–93, 666, 239, 244, 250–53

(56) References Cited

U.S. PATENT DOCUMENTS

| | | | | |
|---|---|---|---|---|
| 4,021,276 A | * | 5/1977 | Cho et al. | 156/644 |
| 4,920,065 A | * | 4/1990 | Chin et al. | 437/52 |
| 5,554,880 A | | 9/1996 | Metzler et al. | |
| 5,825,079 A | | 10/1998 | Metzler et al. | |
| 5,895,273 A | * | 4/1999 | Burns et al. | 438/719 |
| 5,898,982 A | | 5/1999 | Metzler et al. | |
| 5,932,922 A | | 8/1999 | Metzler et al. | |
| 6,002,574 A | | 12/1999 | Metzler et al. | |
| 6,008,140 A | * | 12/1999 | Ye et al. | 438/742 |
| 6,083,831 A | * | 7/2000 | Dennison | 438/666 |
| 6,103,584 A | | 8/2000 | Metzler et al. | |
| 6,107,636 A | * | 8/2000 | Muraki | 250/492.2 |
| 6,277,762 B1 | * | 8/2001 | Hwang | 438/714 |
| 2002/0045354 A1 | * | 4/2002 | Ye et al. | 438/720 |

FOREIGN PATENT DOCUMENTS

JP  11-72631  * 3/1999 ............ G02B/6/10

OTHER PUBLICATIONS

S. Wolf and R. Tauber; Silicon Processing for the VLSI Era; Lattice Press, Sunset Beach, CA; 1996; pp. 242–330 & 514–585.

* cited by examiner

Primary Examiner—Matthew Smith
Assistant Examiner—Granvill D Lee, Jr.
(74) Attorney, Agent, or Firm—Blakely, Sokoloff, Taylor & Zafman LLP

(57) ABSTRACT

A process of forming fine repetitive geometries using a mask having large mask dimensions. The pitch of the masking pattern on the mask is divided by the process to obtain a smaller pitch in the fine repetitive geometries. At least two working materials are used one of which can be etched without etching a substrate. In one embodiment the two working materials and the substrate are each etched independently. In other embodiments, the substrate and one working material have similar etch rates while the other material is etched independently. Pedestals are formed having an initial pitch. First sidewalls are formed around the pedestals. The pedestals are removed and a second and third sidewall are formed on the inside and outside surfaces of the first sidewall having spaces there-between. The first sidewall is removed generating another space between the second and third sidewall. The spaces and the widths of the second and third sidewalls form final pitches substantially smaller than the initial pitch of the pedestals. The process can be used in semiconductor manufacturing processes as well as other fields. Various geometric shapes for patterning by the method are disclosed.

35 Claims, 9 Drawing Sheets

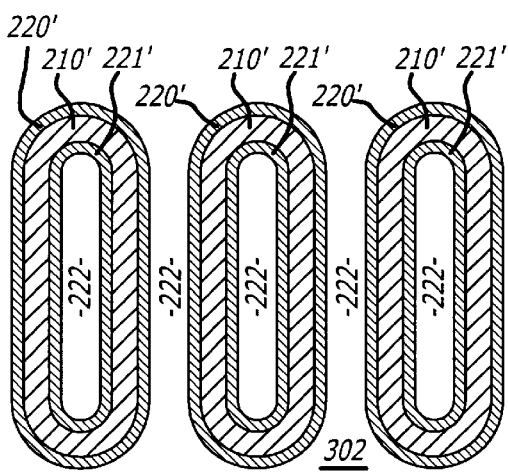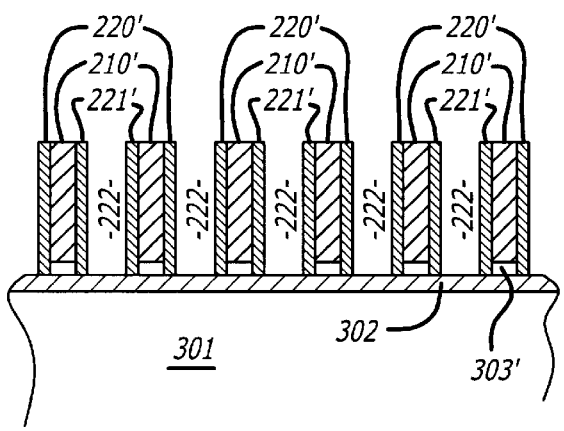
FIG. 8A  FIG. 8B
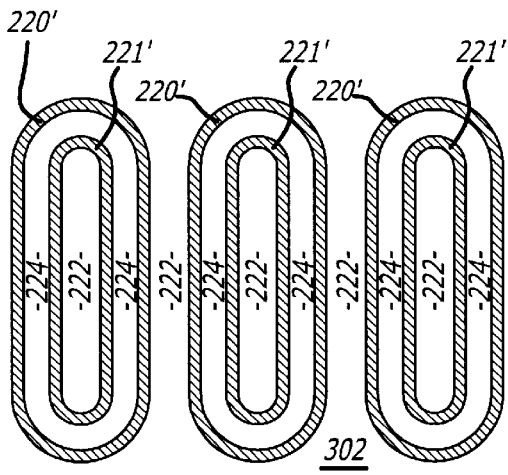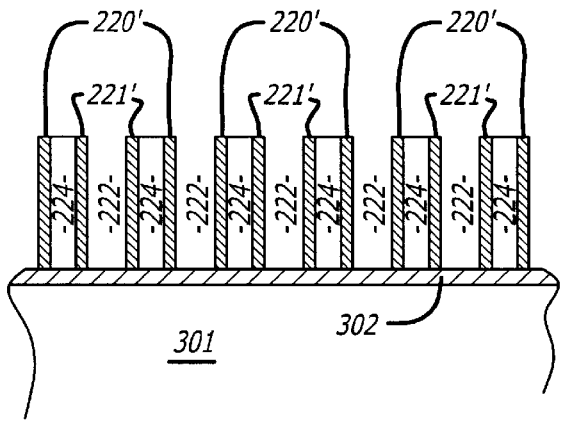
FIG. 9A  FIG. 9B
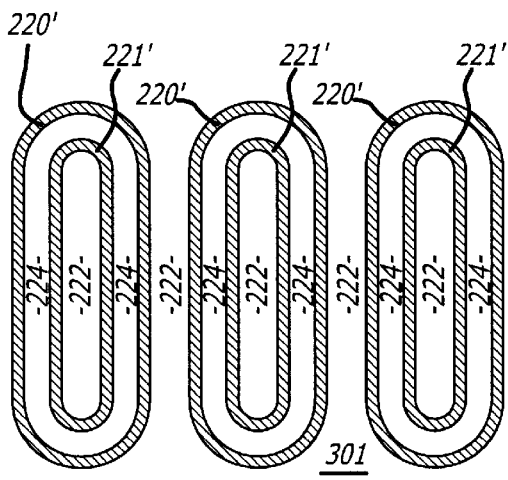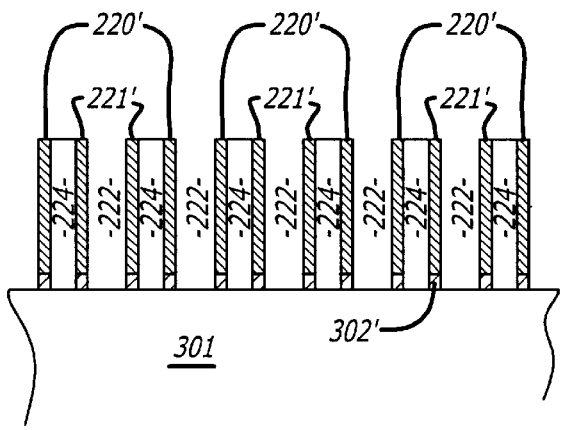
FIG. 10A  FIG. 10B

METHOD AND APPARATUS FOR PATTERNING FINE DIMENSIONS

FIELD OF THE INVENTION

The present invention generally relates to the field of photolithographic patterning. The present invention particularly relates to patterning small dimensions in a semiconductor process.

BACKGROUND OF THE INVENTION

It is desirable to form smaller geometries or dimensions for semiconductor devices for a number or reasons including to decrease manufacturing costs. A smaller semiconductor device uses less area on a wafer so that additional devices can be formed in the same area of a wafer. More dense features allows for more dense devices, such as increased channel width in MOSFETs which leads to lower on resistance. However, forming these smaller geometries requires better semiconductor manufacturing equipment that can support the smaller geometries. Having to purchase new manufacturing equipment to support the smaller geometries can be very costly.

For example, geometries in today's semiconductor devices are approaching 0.12 um. Aligning mask layers to pattern geometries or dimensions of this size is a significant challenge. Alignment equipment to meet such device sizes needs to be very accurate and as result is very expensive. Additionally, the wavelength of light or other electromagnetic radiation used to expose a photoresist through patterned mask openings has become increasingly shorter. It is suggested that x-rays, having a shorter wavelength, be used instead of light to expose photoresists. However, X-ray lithographic equipment is very expensive. Thus, it is desirable to manufacture devices having fine geometries by using larger mask dimensions in order to avoid purchasing new manufacturing equipment and provide less expensive processing.

Additionally, by providing finer geometry devices, die size can be reduced in order to reduce manufacturing costs of devices. It is desirable to form more densely packed devices into each square area of an integrated circuit.

BRIEF SUMMARY OF THE INVENTION

The present invention is briefly summarized by the claims that are found below.

BRIEF DESCRIPTION OF THE FIGURES

FIGS. 5A–5B, 6A–6B, 7A–7B, 8A–8B, 9A–9B, 10A–10B, 11A–11B, and 12A–12B are top views and cross-section side views illustrating yet another embodiment for forming fine geometric dimensions of a repetitive pattern using a mask.

Like reference numbers and designations in the drawings indicate like elements providing similar functionality.

DETAILED DESCRIPTION OF THE PRESENT INVENTION

The present invention is used to form fine repetitive lines or fine repetitive geometric shapes using a self aligned masking technique so that alignment is not critical and having mask dimensions of a masking pattern which are larger to allow the use of less expensive photolithography equipment. The fine repetitive lines or fine repetitive geometric shapes are formed on a substrate or other support surface. The fine lines and fine geometric shapes are repetitive in nature. The pitch of the repetitive pattern is controlled by the dimensions of the masking pattern and processing parameters. The present invention is particularly applicable to semiconductor manufacturing processes but can also be used in other applications and fields such as to generate diffraction gratings or ruled gratings for laser positioning systems.

The present invention uses two working materials and a substrate or support surface. In the case of a semiconductor manufacturing process, the substrate is a semiconductor substrate material such as silicon, SiC, InGaAs, InP, and GaAs. In other manufacturing processes, the substrate is a different material such as sapphire, glass, metal etc. In any case, the substrate and support surfaces are generally referred to herein as substrate. At least one of the two working materials can be etched without etching the substrate.

The at least one of the two working materials which can be etched without etching the substrate is referred to herein as "material1". The second working material may or may not have a high etch selection ratio, as compared to the substrate, and is referred to herein as "material2".

In semiconductor manufacturing processes it is well known that there is a high etch selection ratio between SiOx (such as silicon-dioxide and silicon-oxide) and silicon when etching materials by wet etch processing procedures. A high etch selection ratio may also be obtained in certain cases when etching the materials by dry etch processing procedures. The effect of a high etch ratio can also be obtained during dry etching by using appropriate end detection techniques; such as, etching an oxide layer over silicon, and detecting a change in the concentrations of silicon and oxygen in the gaseous etch effluents when the underlying silicon layer is reached.

In one embodiment of the present invention, material1, material2 and a substrate are each etched independently of one another. In another embodiment of the present invention, material2 and the substrate have similar etch rates and are etched together while material1 is etched independently. Various geometric shapes for patterning by the present invention are disclosed herein as well.

Figure 1:
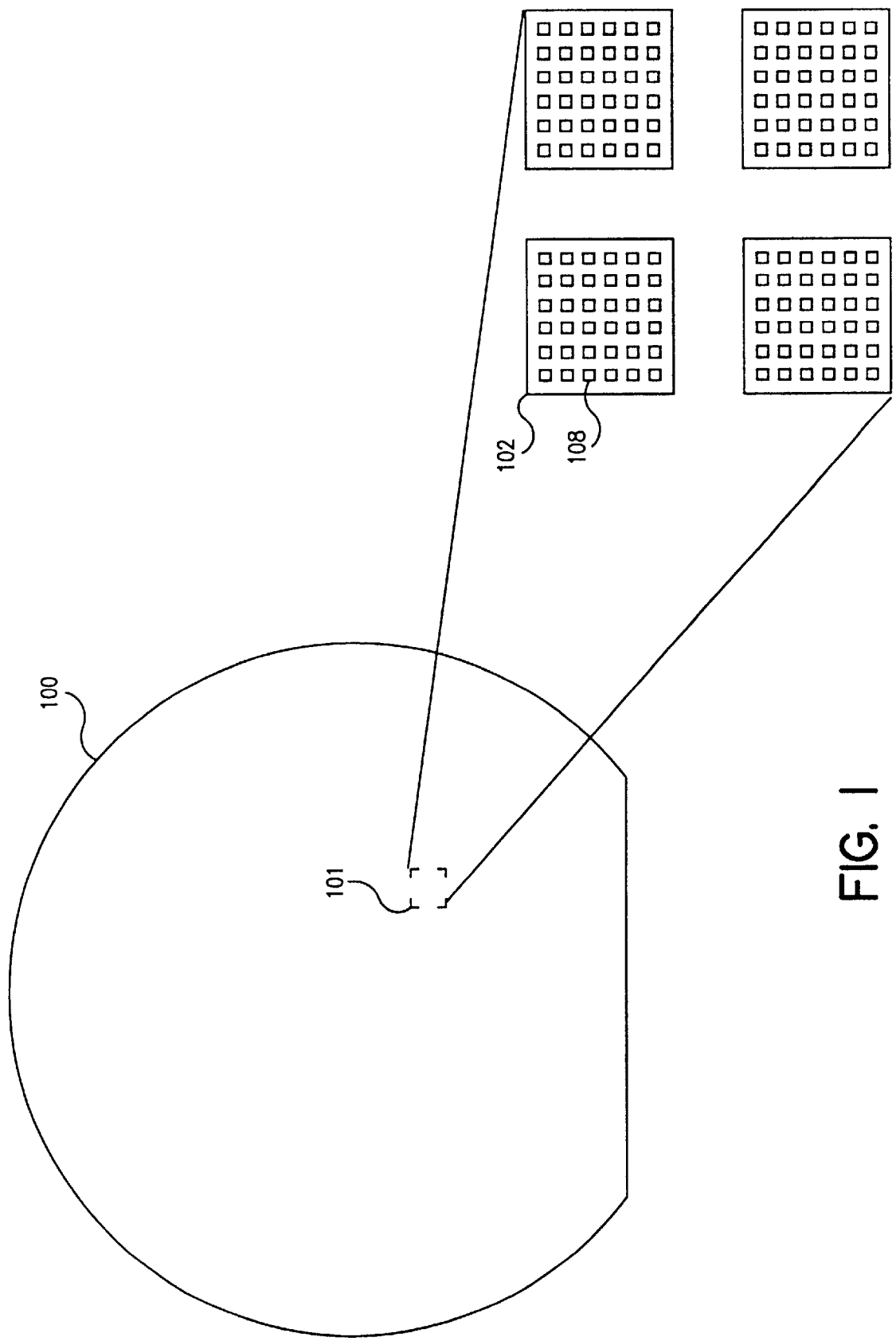
FIG. 1 illustrates a semiconductor wafer with a repetitive geometric pattern.

Referring now to FIG. 1, a semiconductor wafer 100 having a repetitive geometric pattern is illustrated. An exploded view of a portion 101 of the wafer 100 is illustrated as well. The wafer 100 includes a plurality of device areas 102. Each of the device areas 102 includes a repetitive geometric pattern 108 which is patterned in accordance with the present invention using semiconductor manufacturing processes and techniques. Scribe channels are defined between device areas 102 in order to separate them after completion of processing the wafer 100. It is understood that there are several hundred device areas 102 on the wafer 100, with only four being shown in FIG. 1. Each individual device area 102 can contain thousands of the repetitive geometric pattern 108.

Referring now to FIGS. 2A through 2I, the steps of one embodiment to form fine geometries using larger mask dimensions is illustrated. In the embodiment depicted in FIGS. 2A–2I, material1 and material2 are etched independently. In the case of semiconductor processing for example, material1 and material2 can be polysilicon and oxide or oxide and polysilicon respectively in alternate embodiments. In the first steps of the present invention, a repetitive pattern of "pedestals" of material1 are formed on the surface of a substrate or a support material. The pedestals as will be further illustrated can be of any shape including circles, squares, rectangles, bars, etc. The repetitive pattern of pedestals has a cross-section dimension or width and a spacing there between to form a pitch of the repetitive pattern. Either of the width and spacing dimensions can be modified to alter the dimensions of the fine geometries of the end result.

Figure 2A:
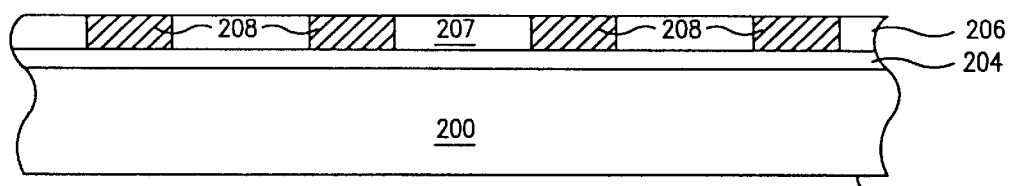
FIGS. 2A–2I are cross-sectional views illustrating the steps in one embodiment for forming fine geometric dimensions of a repetitive pattern using a mask.

In FIG. 2A, material1 200 is deposited or grown onto a support member 201. The support member 201 may be a substrate or a backing which facilities supporting the fine geometries. If the support member 201 is a substrate, it is etched independently of material1 and material2. A photoresist 204 is deposited on top of the material1 layer 200. A mask 206 having a desired pattern is used to generate a first geometric shape. The dimensions of the repetitive pattern of the desired geometric shape is larger than the desired end result. The end resultant fine geometries of the repetitive pattern has a smaller pitch than ordinarily obtained from the pitch of the mask dimensions.

Figure 2B:
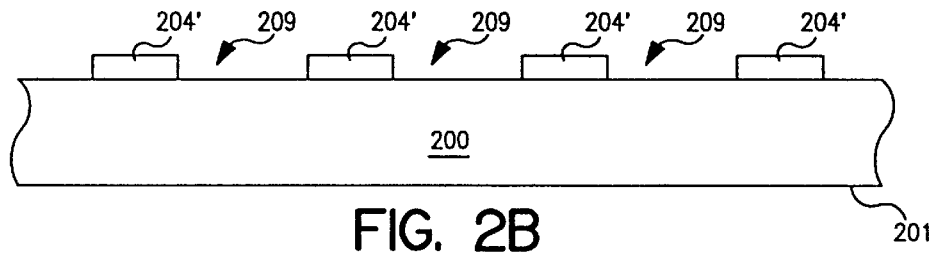

The mask 206 has a pattern 208 therein which blocks light or other electromagnetic radiation from propagating through areas of the mask 206. Openings 207 in the pattern of the mask 206 exposes the photoresist material 204 to the electromagnetic radiation. After the photoresist 204 is exposed to the electromagnetic radiation, those areas can be then etched away leaving the pattern photoresist 204' on the material1 layer 200 as illustrated in FIG. 2B. The pattern of photoresist 204' has openings 209 exposing the material1 layer 200.

Figure 2C:
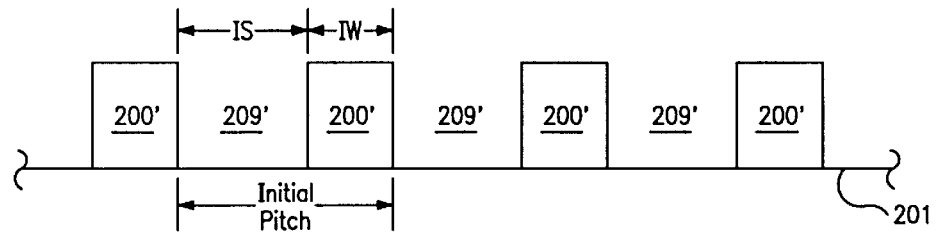

The material1 layer 200 which is exposed at openings 209 can be etched away to the support material 201. Preferably the exposed portions of the material1 layer 200 are etched away by plasma etching so that pedestals 200' will have substantially straight (vertical) sidewalls, as opposed to somewhat tapered sidewalls typically provided by wet etching. After etching, the pattern of photoresist 204' is then removed from the surfaces to generate the patterned pedestals 200' formed from the material1 layer 200 as illustrated in FIG. 2C.

The repetitive pattern of the pedestals 200' formed out of the layer of material1 establishes the initial pitch (IP). The initial pitch is formed of an initial space (IS) 209' between the pedestals 200' and an initial width (IW) of the pedestals 200'. The initial pitch is the sum of dimension of the initial space IS and the initial width IW. IP=IS+IW. In one embodiment, the initial width is 0.3 microns (um) and the initial space is 0.5 um forming an initial pitch of 0.8 um. In another embodiment, the initial width is 0.75 um and the initial space is 1.25 um forming an initial pitch of 2 um. By varying these initial dimensions in the pedestals, other resultant dimensions in fine geometries can be obtained. The repetitive pattern of pedestals 200' becomes a construction element for the next step of the process.

Figure 2D:
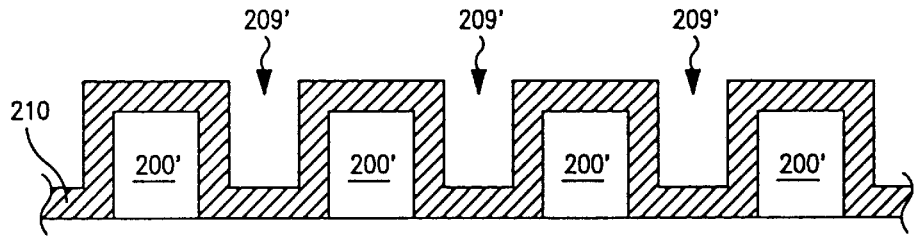

After the pattern of pedestals 200' is formed, a layer of material2 210 is uniformly deposited onto the exposed horizontal and vertical surfaces of the first geometric pattern 200' as illustrated in FIG. 2D. Such a deposition can be done by Chemical Vapor Deposition (CVD) techniques commonly used in semiconductor processing. The layer of material2 210 surrounds the pattern 200' and is also deposited there between in the spaces 209'.

After depositing the material2 layer 210, a selective etch can be used to etch away its horizontal portions to the top of the pattern 200' and in the spaces 209' down to the supporting material 201. The selective etch only etches vertically the exposed horizontal portions of the material2 layer 210. A Reactive Ion Etch (RIE) utilized in semiconductor manufacturing processes is used to perform the selective etching or vertical etching of horizontal surfaces. This results in leaving patterned sidewalls 210' of material2 intact surrounding the patterned pedestals 200' of material1 as illustrated by the cross sections 210A' and 210B' in FIG. 2E. Each of the cross sections 210A' and 210B' have a width (W2) and a space 212 between them.

Figure 2E:
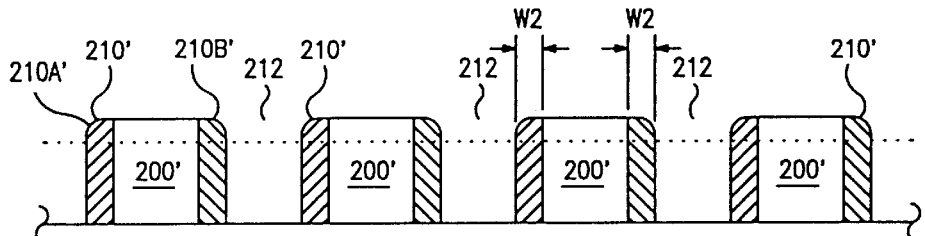
Figure 2F:
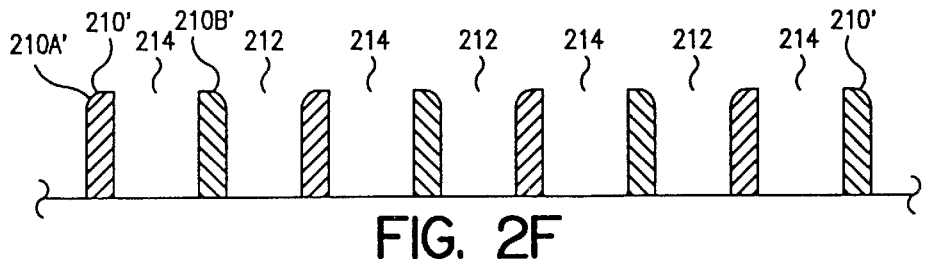

Referring now to FIG. 2F, after forming the sidewalls 210', another etch is used to etch away the patterned pedestals 200' of material1. This results in the sidewalls 210' having spaces 214 between their cross sections 210A' and 210B' as well as spaces 212. This etching step may be a "wet" etch as is used in the semiconductor manufacturing processes. If the material1 of the patterned pedestals 200' is a silicon oxide, the etching step can be a Buffered Oxide Etch (BOE), essentially a bath of diluted hydrofluoric acid and ammonium fluoride. If the pattern sidewalls 210' have the desired width W2 and spacing 212 and 214 therebetween, no further division of the initial pitch is required at this point. In one embodiment the width W2 is 0.25 um while in another embodiment the width W2 is 0.1 um. If the desired feature size of the patterned sidewalls 210' are met, the process can jump to processing the substrate or support surface 201.

Figure 2G:
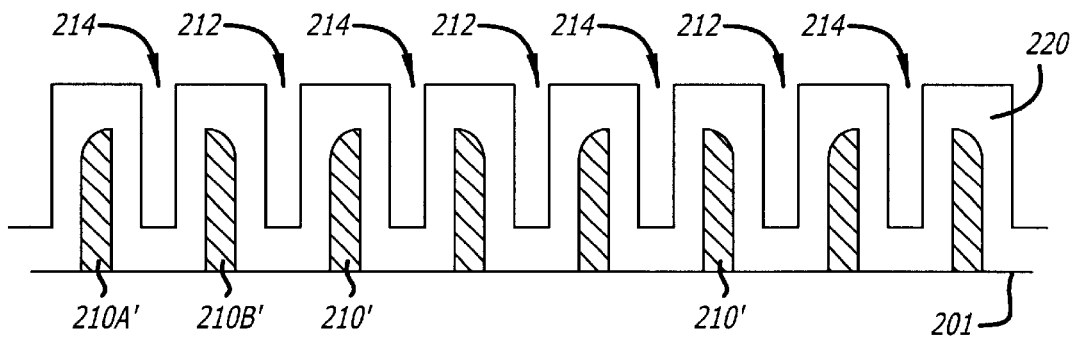

After forming the pattern illustrated in FIG. 2F, an additional division in the initial pitch can be provided. The repetitive pattern of sidewalls 210' becomes a construction element for the next step of the process. A layer of material1 is uniformly deposited onto the exposed horizontal and vertical surfaces of the material2 pattern illustrated in FIG. 2F. Alternatively, a third working material may be used instead of material1. As illustrated in FIG. 2G, a layer 220 of material1 surrounds the repetitive pattern of sidewalls 210' and fills between the spaces 214 and 212.

Figure 2H:
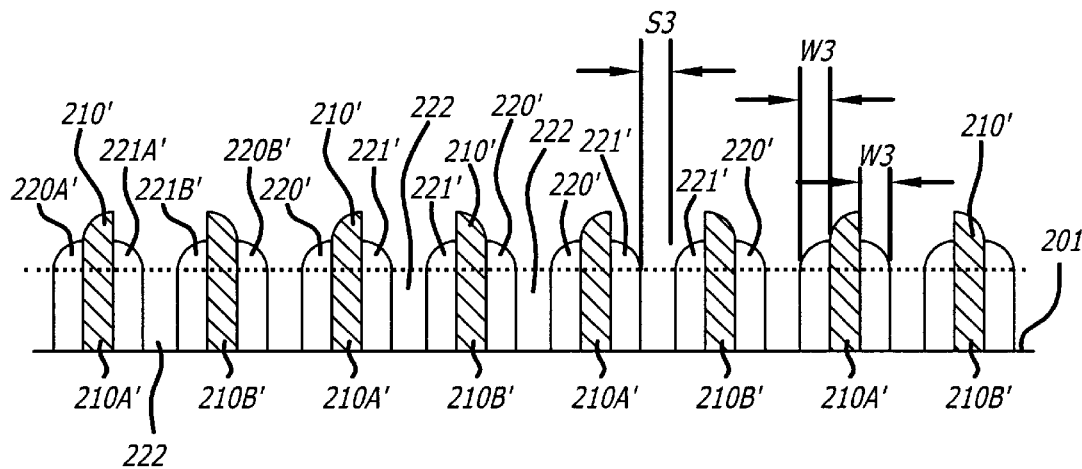

After deposition, a second vertical etch can be used to vertically etch the exposed horizontal areas of the material1 layer 220. This results in a pair of sidewall patterns 220' and 221' sandwiching the sidewalls 210'. Sidewalls 220' couple to the outside surfaces of the sidewalls 210'. Sidewalls 221' couple to the inside surfaces of the sidewalls 210'. Sidewalls 220' have cross-sections 220A' and 220B' and sidewalls 221' have cross-sections 221A' and 221B' as illustrated in FIG. 2H. This second vertical etch step etches the material1 layer 220 below a top portion of the sidewalls 210' as illustrated in FIG. 2H. This second vertical etch generates a space 222 between the cross-sections 221A' and 221B' of the sidewalls 221'. The mask patterning and the second vertical etch process can be controlled such that the spaces 222 are substantially similar to the widths W2 of the cross-sections 210A' and 210B'. The width of the space 222 is illustrated as S3 in FIG. 2H.

Figure 2I:
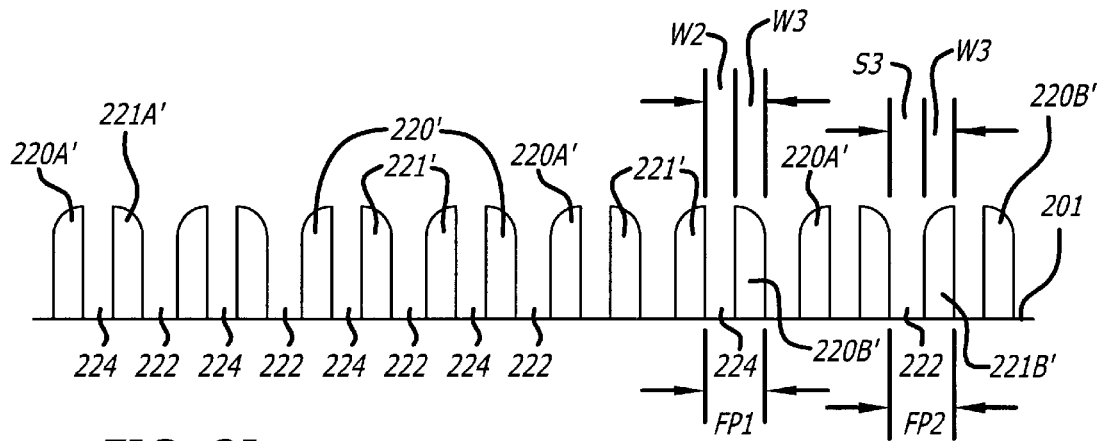

Referring now to FIG. 2I, after the second vertical etch step has etched away the selected portions of the layer 220, another etch step can be used to remove the sidewall 210'.

This etch step removes the material2 sidewall 210' of having the cross-sections 210A' and 210B' down to the support member 201. Spaces 224 between the patterned sidewalls 220' and 221' are thereby generated. This etching step may be similar to the prior "wet" etch as is used in semiconductor manufacturing processes but using an etchant that selectively etches material2 instead. The width of the space 224 is the same as the width W2 of the cross-sections 210A' and 210B' and is illustrated as W2 in FIG. 2I. By performing this additional etch step, an even finer geometric pattern of material can be achieved as illustrated in FIG. 2I.

The pattern of sidewalls 220' and 221' repeated across the surface of the wafer form two final pitches, FP1 and FP2, which can be substantially similar to one another. Final pitch FP1=W2+W3. Final pitch FP2=S3+W3. Final pitch FP1 is formed from the dimension (width W2) of the space 224 and the dimension (width W3) of the cross-section of material1 of the repetitive pattern 220'. The final pitch FP2 is formed from the dimension (space S3) of the space 222 and the dimension (width W3) of the cross-section of material1 of the repetitive pattern 221'. In one embodiment the final pitches are 0.2 microns with 0.1 um spacing and widths. In another embodiment the final pitches are 0.4 um with 0.1 um widths and 0.3 um spacings.

Referring now to FIGS. 3A–3E, a second embodiment of the present invention is illustrated. A number of steps shown FIGS. 2A–2I which are the same in this second embodiment of the process are not illustrated in FIGS. 3A–3E for simplicity. In this second embodiment, material2 and the substrate have similar etch rates. Exemplary materials for material2 and the substrate in the case of semiconductor manufacturing process are polysilicon and silicon. Material1 and material2 in any case are etched independently of each other. In this case two etch stop layers are added to the process of the present invention to prevent unwanted etching of the substrate because material2 and the substrate etch at essentially the same rate.

Figure 3A:
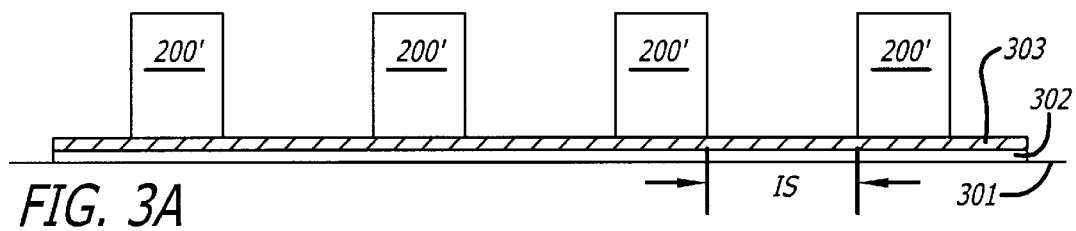
FIGS. 3A–3E are cross-sectional views illustrating the steps in one embodiment for forming fine geometric dimensions of a repetitive pattern using a mask.

Referring now to FIG. 3A, a substrate 301 is covered with a uniform layer 302 of material1 which in turn is covered with a uniform layer 303 of material2 (layer 303 is illustrated as being hatched). A thick layer 200 of material1 is then deposited on top of the uniform layer 303 of material2 similar to that of FIG. 2A. The thick layer 200 is then patterned to form pedestals 200' as was similarly formed in FIGS. 2A–2C. An exemplary thickness of the uniform layers 302 and 303 is around 0.05 um while the thicker layer 200 forming the pedestals 200' is on the order of 0.5 um.

Figure 3B:
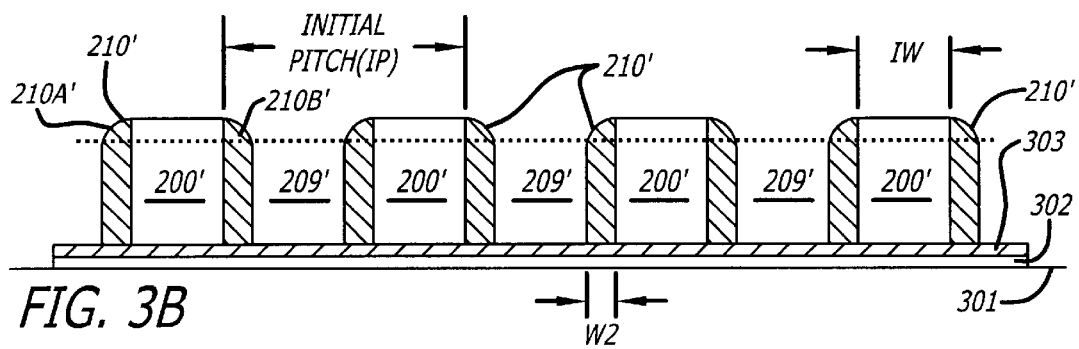

Referring now to FIG. 3B, sidewalls 210' of material2 are formed around the pedestals 200' of material1 similar to that of FIG. 2E. The formation of the sidewalls 201' in FIG. 3B differs only in that there is an over etch such that a portion of the uniform layer 303 of material2 in the exposed region 209' between the adjacent side walls 210' is etched away as well. The amount of overetch is typically not more than 0.01 um to 0.02 um and is therefore not illustrated in FIG. 3B.

Figure 3C:
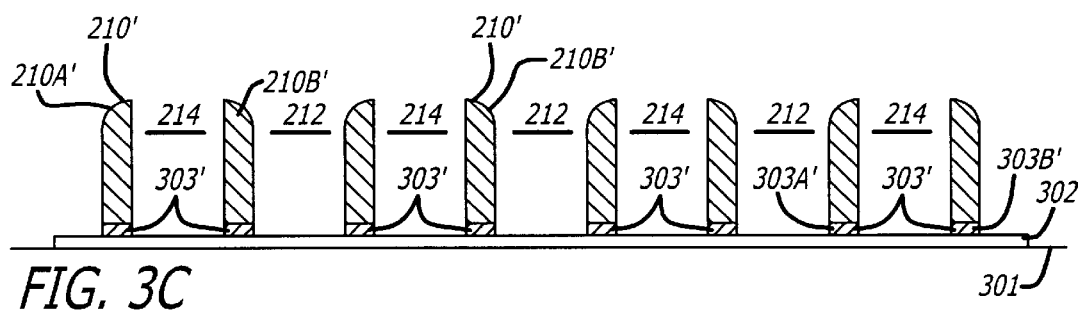

Referring now to FIG. 3C, the pedestals 200' of material1 are removed by etching as well as the exposed portions of the uniform layer 303. The pedestals 200' can be removed using wet etch processing techniques and etchants. They may also be etched using dry etch processing techniques. The exposed portions of the uniform layer 303, between sidewalls 210' and underneath the pedestals 200', are removed using a short reactive ion etching (RIE) step. This short RIE step slightly reduces the height of the sidewalls 210' while retaining the top surface shape.

If the pattern of sidewalls 210' has the desired pitch and further division of the initial pitch is not needed, the process can jump to processing the substrate 301 and the uniform layer 302. If the pattern of sidewalls 210' is desired final resultant pitch, the uniform layer 302 of material1 can be etched by RIE. If the pattern of sidewalls 210' is the desired end result, the uniform layer 302 which acts as one of the two etch stop layers can be omitted by reversing the material sequence. That is, the uniform layer 303 is formed of material1 and provides one etch stop layer, the pedestals 200' are formed out of material2, and the sidewalls 210' are formed out of material1. In this manner, an extra layer of material (uniform layer 302) need not be removed to obtain the final pattern.

Figure 3D:
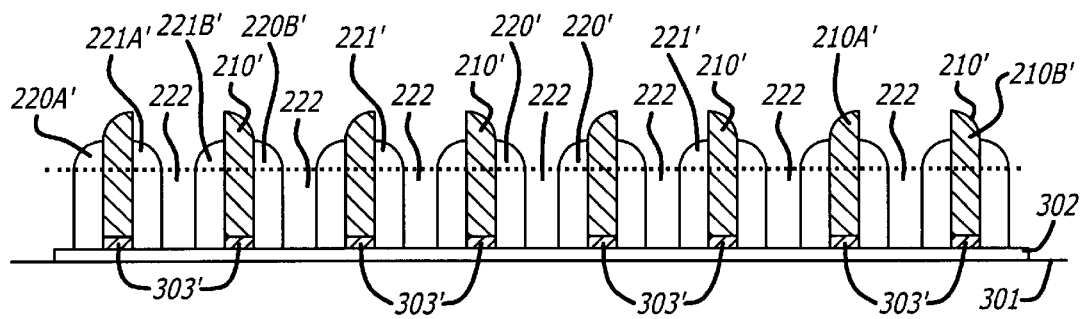

Referring now to FIG. 3D, sidewalls 220' and 221' are formed from the layer 220 of material1 onto the sidewalls 210' of material2. The layer 220 is over etched as well etching slightly into the uniform layer 302.

Figure 3E:
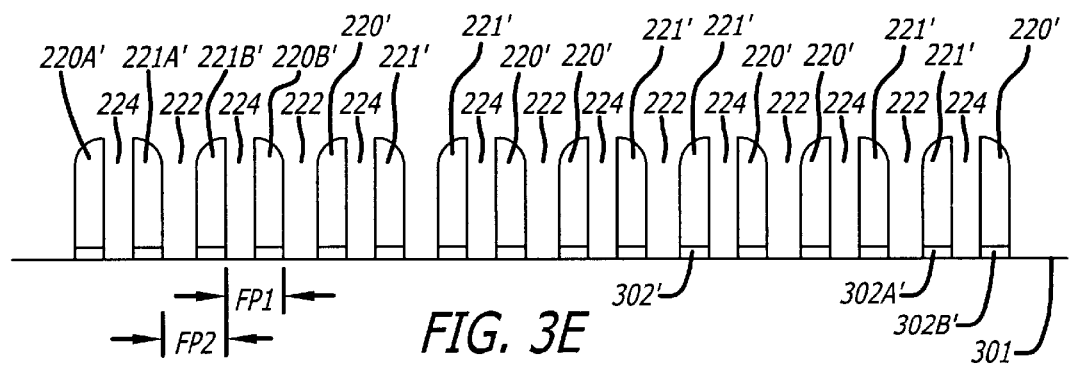

Referring now to FIG. 3E, sidewalls 210' formed of material2 are etched away as previously discussed with reference to FIGS. 2H and 2I. If the uniform layer 303 differs from the material1 of the sidewalls 210', any material 303' under the sidewalls 210' can be removed by a light reactive ion etch (RIE) step. Next in the process, portions of the uniform layer 302 between the sidewalls 220' and 221' are etched away to expose the substrate 301. Portions 302' remain under the sidewalls 220' and 221'. At this point, the substrate 301 is ready for further processing.

Figure 4A:
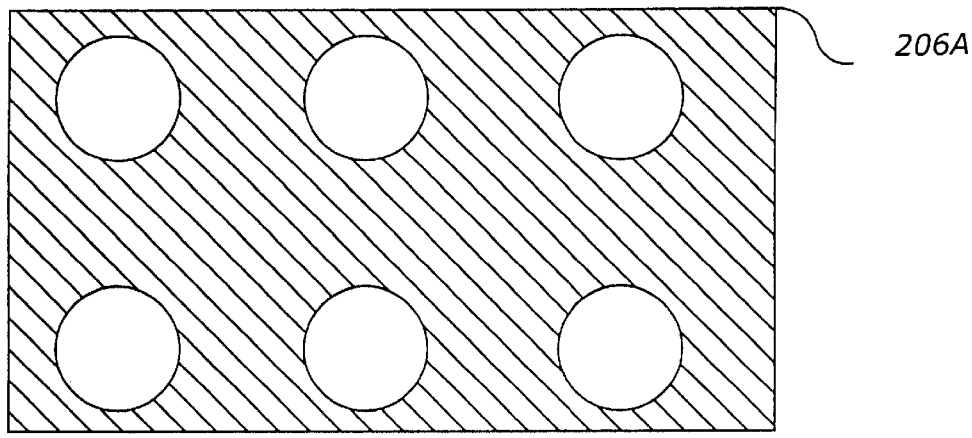
FIGS. 4A–4C are top views of exemplary patterns of geometric shapes in a mask.
Figure 4B:
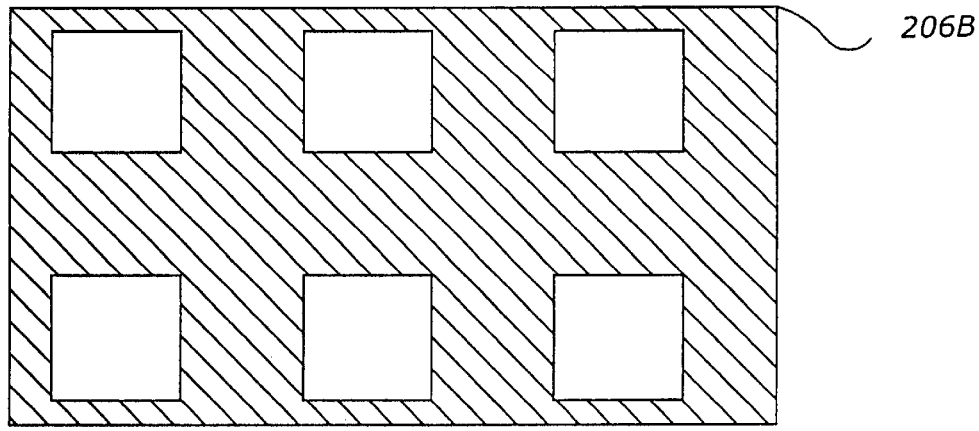
Figure 4C:
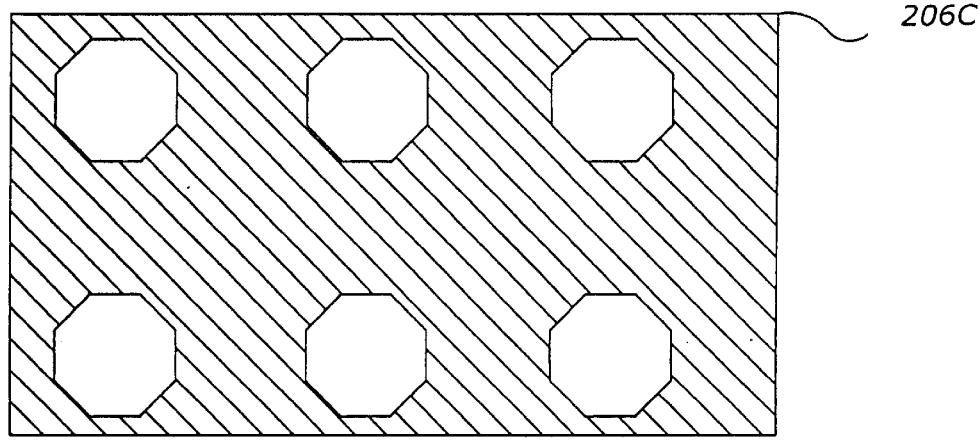

Referring now FIGS. 4A, 4B and 4C exemplary mask patterns are shown for forming a plurality of pedestals 200' across a wafer 100. The pedestals 200' are the repetitive pattern used to form the finer geometries of cylindrical material having a hollow center portion. FIG. 4A illustrates the mask pattern for forming circular cylindrical pedestals. FIG. 4B illustrates the mask pattern for forming square cylindrical pedestals. FIG. 4C illustrates the mask pattern for forming octagonal cylindrical pedestals.

FIGS. 5A–12A and FIGS. 5B–12B illustrate top views and cross-sectional side views illustrating respectively of the another embodiment for forming fine geometric dimensions of a repetitive pattern using a mask.

Figure 5A:
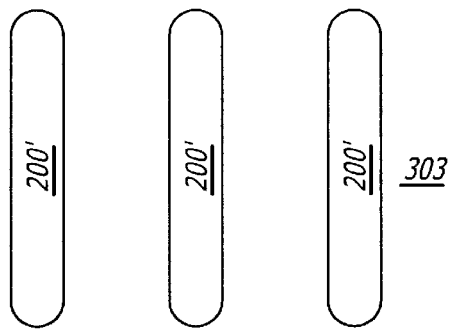
Figure 5B:
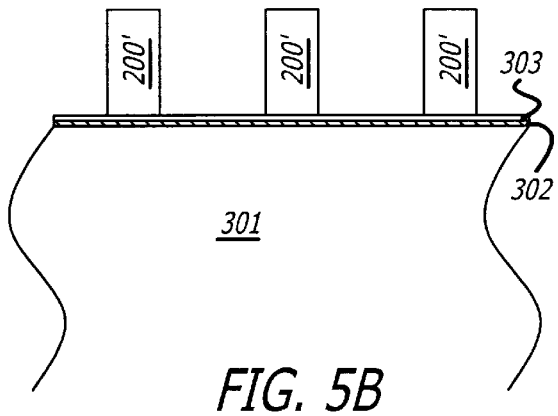

Referring now to FIGS. 5A and 5B, a substrate 301 is covered with a uniform layer 302 of material1 and a uniform layer 303 of material2. A thick layer 200 of material2 is then deposited on top of the uniform layer 303. The thick layer 200 is then patterned using a mask 206 to form pedestals 200' as was similarly formed in FIGS. 2A–2C. The mask 206 has repetitive patterns of oval geometric shapes to form the oval pedestals 200' illustrated in FIGS. 5A and 5B.

Figure 6A:
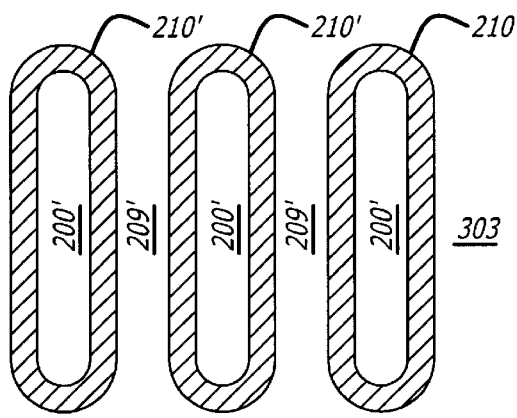
Figure 6B:
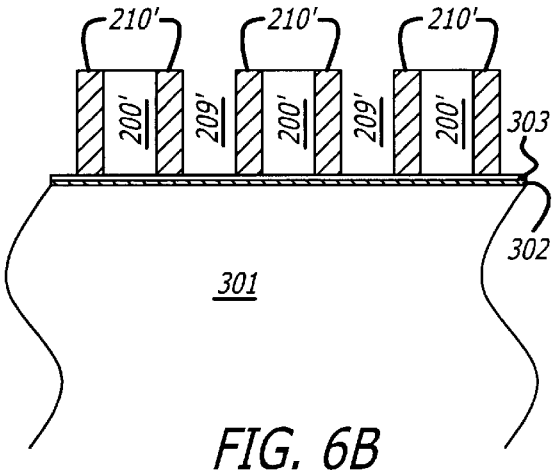

Referring now to FIGS. 6A and 6B, sidewalls 210' of material1 are formed around the pedestals 200'. Between the repetitive pattern of sidewalls 210' is a space 209'. The top view as illustrated by FIG. 6A, shows the oval cylinders of the sidewalls 210' concentric with the pedestals 200'.

Figure 7A:
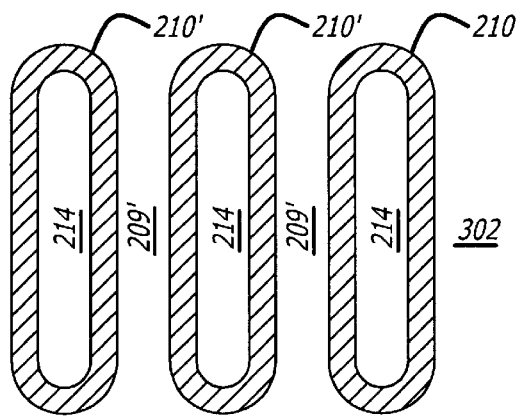
Figure 7B:
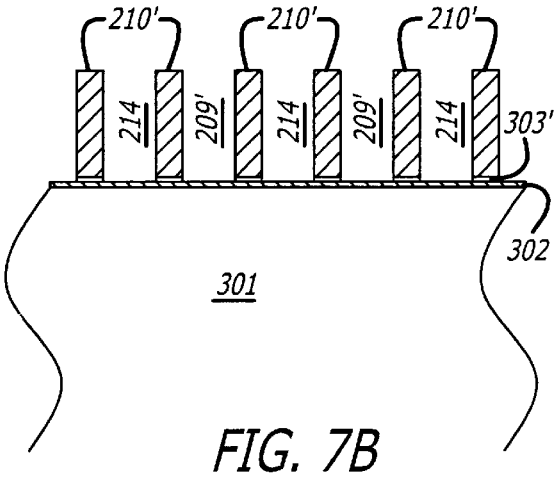

Referring now to FIGS. 7A and 7B, the pedestals 200' of material2 and exposed portions of the uniform layer 303 are removed by an etching step leaving a repetitive pattern of hollow cylindrical sidewalls 210' having a cross-section of the width of the sidewall. Spaces 214 are formed therein, while spaces 209' remain between adjacent sidewalls 210'. A hollow cylindrical portion 303' of the uniform layer 303 remains intact under the hollow cylindrical sidewalls 210'. The uniform layer 302 provides an etch stop to keep the substrate 301 from being etched. However, if the pattern of sidewalls 210' has the desired pitch, further division of the initial pitch is not needed and the process can jump to processing the substrate 301 and the uniform layer 302.

Referring now to FIGS. 8A and 8B, sidewalls 220' and 221' are formed onto the uniform layer 302 from a layer 220 of material2 on outside and inside surfaces respectively of the material1 sidewalls 210'. Spaces 222 are formed within the central hollow sidewall cylinders 221' by selective vertical etching.

Referring now to FIGS. 9A and 9B, sidewalls 210' formed of material1 and portions 303' of the uniform layer 303 are etched away down to the uniform layer 302 thereby forming spaces 224 between concentric hollow sidewall cylinders 220' and 221'.

Referring now to FIGS. 10A and 10B, the exposed portions of the uniform layer 302 of material1 in spaces 222 and 224 is removed by a light reactive ion etch (RIE) exposing the substrate 301. Portions 302' of the uniform layer 302 remain under the sidewalls 220' and 221'. At this point, the substrate 301 is ready for further processing if desired.

Figure 11A:
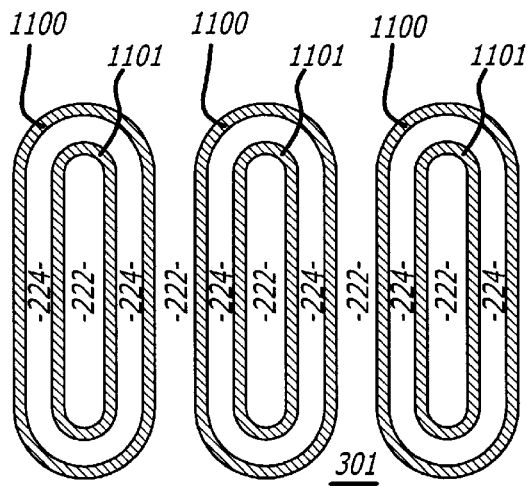
Figure 11B:
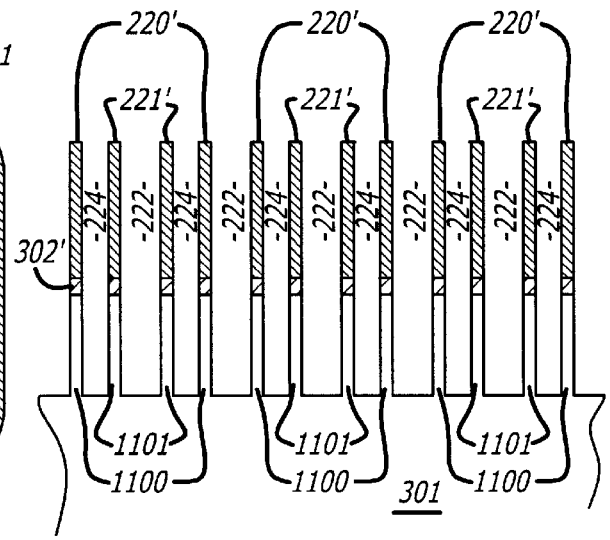

Referring now to FIGS. 11A and 11B, the substrate 301 is etched in the spaces 222 and 224 where its exposed forming hollow cylindrical sidewalls 1100 and 1101 formed of the substrate material 301. The sidewalls 1100 correspond with the sidewalls 220' being separated by the portion 302' of the uniform layer 302. The sidewalls 1101 correspond with the sidewalls 221' being separated by the portion 302' of the uniform layer 302.

Figure 12A:
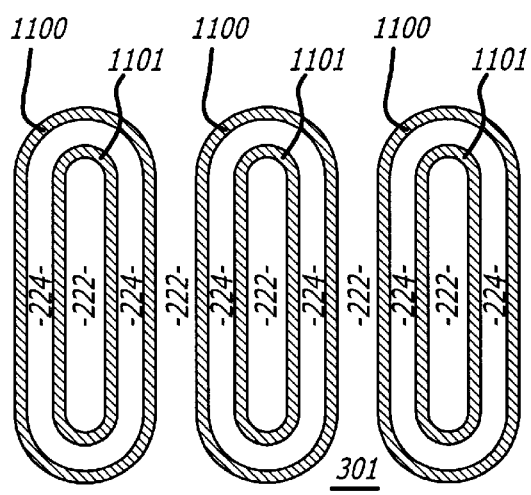
Figure 12B:
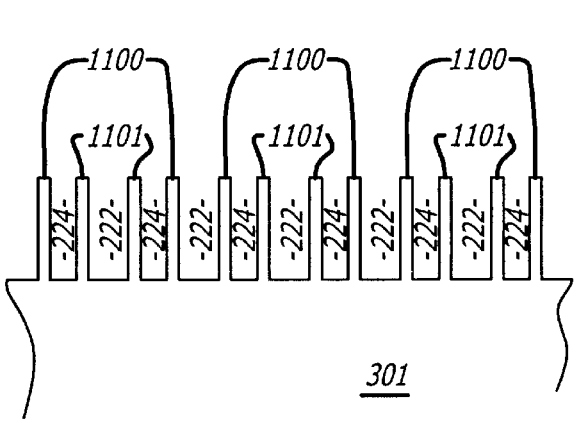

Referring now to FIGS. 12A and 12B, the sidewalls 220' and 221' are etched away. The portions 302' of the uniform layer 302 are also etched away leaving the sidewalls 1110 and 1101 of the substrate material extending outward therefrom and being spaced apart by spaces 222 and 224.

Figure 13:
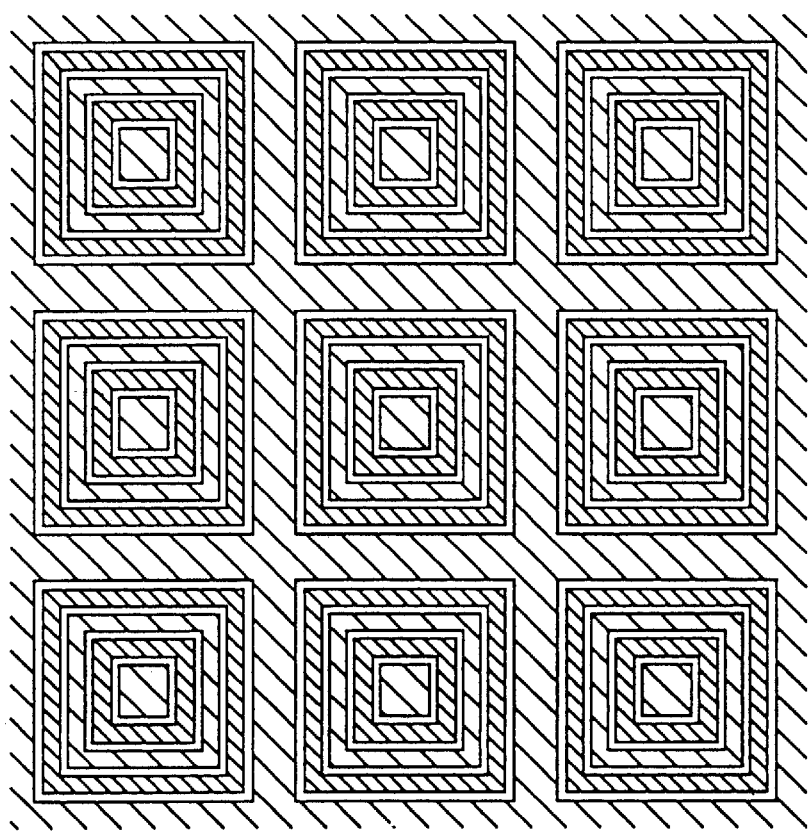
FIGS. 13–15 are top views of alternate embodiments of geometric shapes having the fine geometric dimensions of a repetitive pattern.
Figure 14:
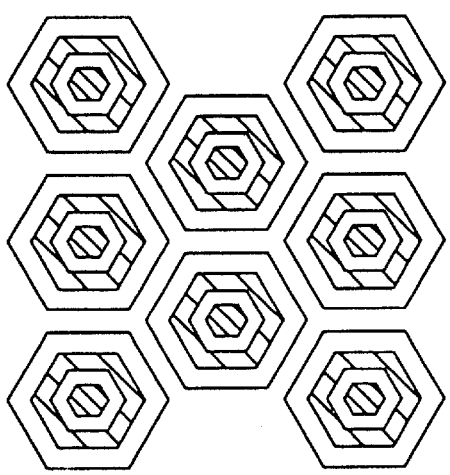
Figure 15:
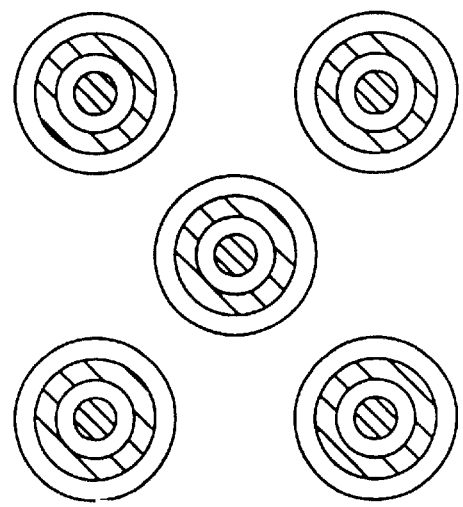

FIGS. 13–15 are top views of alternate embodiments of geometric shapes having the fine geometric dimensions of a repetitive pattern. FIG. 13 illustrates a square or rectangular repetitive pattern to form fine geometries. FIG. 14 illustrates a hexagonal repetitive pattern used to form fine geometries. FIG. 15 illustrates a circular repetitive pattern used to form fine geometries. Each of the resultant patterns have concentric cylindrically shaped sidewalls having a cross-sectional thickness of the final width and spaced apart by the final spacing in order to form the final pitch.

One advantage to the method of the present invention is that finer geometric patterns may be obtained from masking layers and equipment suitable for larger geometric patterns. Another advantage of the present invention is that lower cost devices can be obtained by having fine geometries and by using less expensive equipment. Another advantage of the present invention is that a self aligned structure can be formed without critical mask alignment requirements with respect to the fabrication techniques used herein.

In certain instances in the foregoing description, certain alternate materials and methods were set forth. For example, the layers of thickness of materials used to form the sidewalls can be altered to obtain different feature widths and spacings. It is evident that modification to the sequences of depositions, etches and implants can be made to produce the same result but using a different process sequence. It is to be noted however, that the identification of specific alternative materials and processes is not to infer that still other materials and processes for those or other steps in the process of fabrication or in the resulting devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention and methods of fabricating the same may be varied without departing from the spirit and scope of the invention.

What is claimed is:

1. A method of forming a repetitive pattern comprising:
   using a mask having a repetitive pattern with an initial pitch to form pedestals on a substrate having the initial pitch;
   forming first sidewalls having a first cross-sectional width on the substrate around the pedestals;
   removing the pedestals leaving the first sidewalls on the substrate having a first space there-between; and,
   wherein the first cross-sectional width and the first space form a first final pitch less than the initial pitch of the mask.

2. The method of claim 1 of forming a repetitive pattern, wherein,
   the repetitive pattern is formed on the substrate of a semiconductor wafer and the first sidewalls and the second sidewalls are semiconductor layers.

3. The method of claim 1 of forming a repetitive pattern, wherein,
   the first sidewalls form hollow cylinders.

4. A method of forming a repetitive pattern comprising:
   using a mask having a repetitive pattern with an initial pitch to form pedestals on a substrate having the initial pitch;
   forming first sidewalls having a first cross-sectional width on the substrate around the pedestals;
   removing the pedestals leaving the first sidewalls on the substrate having a first space there-between;
   forming second sidewalls having a second cross-sectional width and third sidewalls having a third cross-sectional width on an inside surface and an outside surface respectively of the first sidewalls on the substrate, the second sidewalls and the third sidewalls being spaced apart by a second space;
   removing the first sidewalls leaving the second sidewalls and the third sidewalls and generating a third space between the second sidewalls and the third sidewalls; and,
   wherein the first cross-sectional width and the first space form a first final pitch less than the initial pitch of the mask and the second space and the second cross-sectional width form a second final pitch and the third space and the third cross-sectional width form a third final pitch, the second final pitch and the third final pitch less than the initial pitch of the mask.

5. The method of claim 4 of forming a repetitive pattern, wherein,
   the first sidewalls form first hollow cylinders; and
   the second sidewalls form second hollow cylinders concentric with the first hollow cylinders.

6. A method of forming fine geometry patterns using a mask having larger mask pattern dimensions, the method comprising:
   providing a substrate and forming a repetitive pattern of pedestals on the substrate out of a first working material, the repetitive pattern of pedestals having an initial pitch;
   depositing a layer of a second working material on the substrate and the repetitive pattern of pedestals;
   vertically etching horizontal portions of the layer of the second working material to form first sidewalls of the second working material surrounding the side surfaces of the repetitive pattern of pedestals, the first sidewalls of the second working material having a first width dimension and being spaced apart by a first spacing;

etching away the repetitive pattern of pedestals leaving the first sidewalls of the second working material extending from the substrate; and wherein the first sidewalls have a first pitch of the first spacing and the first width less than the initial pitch of the repetitive pattern of pedestals.

7. The method of claim 6, wherein
the etched away repetitive pattern of pedestals forms a second spacing of the first sidewalls and
wherein the first sidewalls have a second pitch of the second spacing and the first width less than the initial pitch of the repetitive pattern of pedestals.

8. The method of claim 6, wherein,
the first working material and the second working material etch independently of each other and
the second working material and the substrate material forming the substrate etch at the same rate.

9. The method of claim 6, wherein,
the first working material and the second working material etch independently of each other and
the second working material and the substrate material forming the substrate etch at differing rates.

10. The method of claim 6, wherein,
the depositing of the layer of the second working material on the substrate and the repetitive pattern of pedestals is preformed using chemical vapor deposition.

11. The method of claim 6, wherein,
the vertically etching of horizontal portions of the layer of the second working material is preformed using a reactive ion etch.

12. The method of claim 6, wherein,
the etching away of the repetitive pattern of pedestals is preformed using a wet etch.

13. The method of claim 6, wherein,
the repetitive pattern is formed on the substrate of a semiconductor wafer and the first sidewalls are a semiconductor layer.

14. A method of forming fine geometry patterns using a mask having larger mask pattern dimensions, the method comprising:
providing a substrate and forming a repetitive pattern of pedestals on the substrate out of a first working material, the repetitive pattern of pedestals having an initial pitch;
depositing a layer of a second working material on the substrate and the repetitive pattern of pedestals;
vertically etching horizontal portions of the layer of the second working material to form first sidewalls of the second working material surrounding the side surfaces of the repetitive pattern of pedestals, the first sidewalls of the second working material having a first width dimension and being spaced apart by a first spacing;
etching away the repetitive pattern of pedestals leaving the first sidewalls of the second working material extending from the substrate;
depositing a layer of the first working material on the substrate and the first sidewalls;
vertically etching horizontal portions of the layer of the first working material to form second sidewalls of the first working material on inside surfaces of the first sidewalls and to form third sidewalls of the first working material on outside surfaces of the first sidewalls, the second sidewalls having a second width, the third sidewalls having a third width, the second sidewalls and the third sidewalls being spaced apart by a second spacing;

etching away the first sidewalls leaving the second and third sidewalls of the first working material extending from the substrate, the etched away first sidewalls forming a third spacing between the second and third sidewalls;

wherein the first sidewalls have a first pitch of the first spacing and the first width less than the initial pitch of the repetitive pattern of pedestals; and wherein the second sidewalls have a second pitch of the second spacing and the second width less than the initial pitch of the repetitive pattern of pedestals.

15. The method of claim 14, wherein,
the third sidewalls have a third pitch of the third spacing and the third width less than the initial pitch of the repetitive pattern of pedestals.

16. The method of claim 14, further comprising:
etching the substrate where exposed in the second spacing and the third spacing between the second and third sidewalls to form extended second and third sidewalls of substrate material;
etching the second and third sidewalls of the first working material away from the substrate leaving the extended second and third sidewalls of the substrate material; and
wherein the extended second sidewalls of the substrate material have the second pitch less than the initial pitch of the repetitive pattern of pedestals and the extended third sidewalls of the substrate material have the third pitch less than the initial pitch of the repetitive pattern of pedestals.

17. The method of claim 14, wherein,
the depositing of the layer of the first working material on the substrate and the first sidewalls is preformed using chemical vapor deposition.

18. The method of claim 14, wherein,
the vertically etching of horizontal portions of the layer of the first working material is preformed using a reactive ion etch.

19. The method of claim 14, wherein,
the etching away of the first sidewalls is preformed using a wet etch.

20. The method of claim 14, wherein,
the first working material and the second working material etch independently of each other and
the second working material and the substrate material forming the substrate etch at the same rate.

21. The method of claim 14, wherein,
the first working material and the second working material etch independently of each other and
the second working material and the substrate material forming the substrate etch at differing rates.

22. The method of claim 14, wherein
the etched away repetitive pattern of pedestals forms a second spacing of the first sidewalls and
wherein the first sidewalls have a second pitch of the second spacing and the first width less than the initial pitch of the repetitive pattern of pedestals.

23. A method of forming a repetitive pattern of at least one semiconductive layer over a semiconductor wafer, the method comprising:
forming a repetitive pattern of pedestals of a first working material over the semiconductor wafer, the repetitive pattern of pedestals having an initial pitch;
depositing a layer of a second working material over the semiconductor wafer;

vertically etching horizontal portions of the layer of the second working material to form first sidewalls of the second working material surrounding side surfaces of the repetitive pattern of pedestals, the first sidewalls of the second working material having a first width dimension and being spaced apart by a first spacing;

etching away the repetitive pattern of pedestals of the first working material leaving the first sidewalls of the second working material formed on the semiconductor wafer; and wherein the first sidewalls have a first pitch of the first spacing and the first width, the first pitch of the first sidewalls less than the initial pitch of the repetitive pattern of pedestals.

24. The method of claim 23, wherein the etched away repetitive pattern of pedestals of the first working material forms a second spacing of the first sidewalls and wherein the first sidewalls have a second pitch of the second spacing and the first width, the second pitch of the first sidewalls less than the initial pitch of the repetitive pattern of pedestals.

25. The method of claim 23, wherein, the first working material and the second working material etch independently of each other.

26. The method of claim 23, wherein, the depositing of the layer of the second working material is preformed using chemical vapor deposition.

27. The method of claim 23, wherein, the vertically etching of horizontal portions of the layer of the second working material is preformed using a reactive ion etch.

28. The method of claim 23, wherein, the etching away of the repetitive pattern of pedestals is preformed using a wet etch.

29. A method of forming a repetitive pattern of at least one semiconductive layer over a semiconductor wafer, the method comprising:

forming a repetitive pattern of pedestals of a first working material over the semiconductor wafer, the repetitive pattern of pedestals having an initial pitch;

depositing a layer of a second working material over the semiconductor wafer;

vertically etching horizontal portions of the layer of the second working material to form first sidewalls of the second working material surrounding side surfaces of the repetitive pattern of pedestals, the first sidewalls of the second working material having a first width dimension and being spaced apart by a first spacing;

etching away the repetitive pattern of pedestals of the first working material leaving the first sidewalls of the second working material formed on the semiconductor wafer;

depositing a layer of the first working material over the wafer;

vertically etching horizontal portions of the layer of the first working material to form second sidewalls of the first working material on inside surfaces of the first sidewalls and to form third sidewalls of the first working material on outside surfaces of the first sidewalls, the second sidewalls having a second width, the third sidewalls having a third width, the second sidewalls and the third sidewalls being spaced apart by a second spacing;

etching away the first sidewalls leaving the second and third sidewalls of the first working material formed on the semiconductor wafer, the etched away first sidewalls forming a third spacing between the second and third sidewalls;

wherein the first sidewalls have a first pitch of the first spacing and the first width, the first pitch of the first sidewalls less than the initial pitch of the repetitive pattern of pedestals; and wherein the second sidewalls have a second pitch of the second spacing and the second width, the second pitch of the second sidewalls less than the initial pitch of the repetitive pattern of pedestals.

30. The method of claim 29, wherein, the third sidewalls have a third pitch of the third spacing and the third width, the third pitch of the third sidewalls less than the initial pitch of the repetitive pattern of pedestals.

31. The method of claim 29, wherein, the vertically etching of horizontal portions of the layer of the first working material is preformed using a reactive ion etch.

32. The method of claim 29, wherein, the etching away of the first sidewalls is preformed using a wet etch.

33. The method of claim 29, wherein, the first working material and the second working material etch independently of each other.

34. The method of claim 29, wherein, the depositing of the layer of the second working material is preformed using chemical vapor deposition.

35. The method of claim 29, wherein the etched away repetitive pattern of pedestals of the first working material forms a second spacing of the first sidewalls and wherein the first sidewalls have a second pitch of the second spacing and the first width, the second pitch of the first sidewalls less than the initial pitch of the repetitive pattern of pedestals.

\* \* \* \* \*